(12) United States Patent
Crucs

(10) Patent No.: US 8,098,247 B2
(45) Date of Patent: Jan. 17, 2012

(54) SYSTEMS AND METHODS FOR GEOMETRIC DATA COMPRESSION AND ENCRYPTION

(75) Inventor: Kevin M. Crucs, Copley, OH (US)

(73) Assignee: Crucs Holdings, LLC, Copley, OH (US)

( * ) Notice: Subject to any disclaimer, the term of this patent is extended or adjusted under 35 U.S.C. 154(b) by 218 days.

(21) Appl. No.: 12/566,260

(22) Filed: Sep. 24, 2009

(65) Prior Publication Data

US 2011/0071991 A1 Mar. 24, 2011

(51) Int. Cl.
*G06T 17/00* (2006.01)

(52) U.S. Cl. ........ 345/420; 345/419; 345/424; 345/428; 345/427; 341/50; 341/51; 341/57; 341/65; 341/67; 382/154; 382/241; 382/237; 382/243; 382/240

(58) Field of Classification Search ............ 341/50, 341/51, 57, 65, 67, 106, 107; 382/154, 241, 382/237, 243, 238, 240; 345/420, 416, 429, 345/419, 424, 428
See application file for complete search history.

(56) References Cited

U.S. PATENT DOCUMENTS

| | | | |
|---|---|---|---|
| 4,772,947 A | 9/1988 | Kono | |
| 4,910,608 A | 3/1990 | Whiteman et al. | |
| 5,226,113 A * | 7/1993 | Cline et al. | 345/424 |
| 5,300,931 A | 4/1994 | Lindsay et al. | |
| 5,333,063 A | 7/1994 | Yoo | |
| 5,522,019 A * | 5/1996 | Bala et al. | 345/424 |
| 5,627,543 A | 5/1997 | Moreira | |
| 5,825,369 A * | 10/1998 | Rossignac et al. | 345/440 |
| 5,870,094 A * | 2/1999 | Deering | 345/419 |
| 6,262,737 B1 | 7/2001 | Li et al. | |
| 6,323,858 B1 | 11/2001 | Gilbert et al. | |
| 6,438,268 B1 | 8/2002 | Cockshott et al. | |
| 6,452,596 B1 | 9/2002 | Gueziec et al. | |
| 6,603,470 B1 | 8/2003 | Deering | |
| 6,697,530 B2 * | 2/2004 | Kenyon et al. | 382/239 |
| 6,747,644 B1 * | 6/2004 | Deering | 345/420 |
| 6,768,817 B1 | 7/2004 | Cheng et al. | |
| 6,778,173 B2 * | 8/2004 | Han et al. | 345/420 |
| 7,224,729 B1 * | 5/2007 | Jang et al. | 375/240.08 |
| 7,436,330 B2 | 10/2008 | Paris | |

(Continued)

FOREIGN PATENT DOCUMENTS

JP 58194464 A 11/1983

(Continued)

*Primary Examiner* — Linh Nguyen
(74) *Attorney, Agent, or Firm* — Hahn Loeser & Parks LLP

(57) ABSTRACT

Systems, methods, and physical computer-readable storage media for performing geometric data compression and geometric data decompression and/or geometric data encryption and geometric data decryption. A virtual geometric compression object is generated within a computer system by defining a plurality of discrete elements arranged in a geometric shape and assigning one or more data bit values to each of the plurality of discrete elements. The virtual geometric compression object is used by the computer system to compress sequences of uncompressed data bits into compression definitions. A compression definition defines a path through the virtual geometric compression object corresponding to a sequence of uncompressed data bits. In a reverse manner, for data decompression, at least a portion of a virtual geometric compression object is generated and a compression definition is used to extract a corresponding sequence of uncompressed data bits from the portion of the virtual geometric compression object.

47 Claims, 5 Drawing Sheets

U.S. PATENT DOCUMENTS

| | | |
|---|---|---|
| 7,551,785 B2 | 6/2009 | Qian et al. |
| 2002/0046218 A1 | 4/2002 | Gilbert et al. |
| 2003/0160776 A1* | 8/2003 | Sowizral et al. ............. 345/418 |
| 2003/0214502 A1* | 11/2003 | Park et al. .................... 345/420 |
| 2005/0131660 A1* | 6/2005 | Yadegar et al. ................... 703/2 |
| 2007/0002068 A1* | 1/2007 | Whitted et al. ............... 345/582 |
| 2007/0094019 A1 | 4/2007 | Nurminen |
| 2007/0097121 A1* | 5/2007 | Loop et al. .................... 345/428 |
| 2007/0160303 A1* | 7/2007 | Guleryuz et al. ............. 382/240 |

FOREIGN PATENT DOCUMENTS

| | | |
|---|---|---|
| JP | 1074589 A | 3/1989 |
| JP | 2141176 A | 5/1990 |
| JP | 10307914 A | 11/1998 |
| JP | 2002149710 A | 5/2002 |
| JP | 2009055308 A | 3/2009 |
| KR | 890003318 B1 | 9/1989 |
| KR | 20020040406 A | 5/2002 |
| WO | 0118743 A1 | 3/2001 |

* cited by examiner

SYSTEMS AND METHODS FOR GEOMETRIC DATA COMPRESSION AND ENCRYPTION

TECHNICAL FIELD

Certain embodiments of the present invention relate to data compression and data decompression and/or data encryption and data decryption. More particularly, certain embodiments relate to systems, methods, and physical computer-readable storage media for performing geometric data compression and geometric data decompression and/or geometric data encryption and geometric data decryption.

BACKGROUND

There are many existing techniques for performing data compression and encryption. With respect to the terms "encryption" and "compression", "encryption" is the more general of the two. Data encryption involves mapping an initial set of data to a second different set of data, ideally in a manner such that a third-party observer of the second encrypted set of data cannot easily, if at all, reconstruct the initial unencrypted set of data. Data decryption involves mapping the second encrypted set of data back to the original initial set of data. The size of the second encrypted set of data may be the same as, smaller than, or larger than the initial unencrypted set of data. When the second encrypted set of data is smaller in size than the initial set of data, then data compression has occurred. Certain compression/encryption techniques lend themselves well to certain applications, and other compression/encryption techniques lend themselves well to other applications. A data compression/encryption technique that lends itself well to many different types of applications is desirable.

Further limitations and disadvantages of conventional, traditional, and proposed approaches will become apparent to one of skill in the art, through comparison of such approaches with the subject matter of the present application as set forth in the remainder of the present application with reference to the drawings.

SUMMARY

An embodiment of the present invention comprises a computer-implemented method of compressing data in a computer system by performing computer-implemented operations. The method includes generating a virtual geometric compression object (VGCO) by defining a plurality of discrete elements arranged in a geometric shape, and assigning one or more data bit values to each of the plurality of discrete elements. Generating a virtual geometric compression object may be accomplished using an apriori definition of a standard geometric compression object. The apriori definition may include at least one of an object-identifying number, an object-dimensioning coefficient, an object generating formula, an object-generating algorithm, or a set of object set-up coefficients. The method further includes storing the VGCO in a first computer-readable memory and reading a sequence of uncompressed data bits from a second computer-readable memory. The method also includes searching the VGCO for the sequence of uncompressed data bits traversing a path of a contiguous portion of the plurality of discrete elements through the VGCO. If the path is found through the VGCO as a result of the searching, then the method further includes recording a compression definition in a third computer-readable memory, where the compression definition defines the path through the VGCO. If the path is not found through the VGCO as a result of the searching, then the method also includes reducing the length of the sequence of uncompressed data bits and performing another search as previously described herein. Furthermore, the method may include changing the length of the sequence of uncompressed data bits (e.g., increasing the length by reading more of the data bits) and performing another search as previously described herein. If more data is to be compressed, a next sequence of data bits may be read and subsequent portions of the method repeated to compress the next sequence of data bits. In accordance with an embodiment of the present invention, the geometric shape of the VGCO may be a rectangular cuboid. The path through the VGCO may be along an orthogonal direction (e.g., x-direction, y-direction, or z-direction) of the rectangular cuboid. Alternatively, the path through the VGCO may be along a diagonal direction through the rectangular cuboid. The compression definition may include an index, address, or coordinates of a starting element within the VGCO and a vector direction through the VGCO from the starting element. The compression definition may further include a vector length in terms of a number of contiguous elements. The compression definition may also include a compression object number identifying the VGCO. As an alternative, the compression definition may include an index, address, or coordinates of a starting element within the VGCO and an index, address, or coordinates of an ending element within the VGCO. The compression definition may further include a compression object number identifying the VGCO. The compression definition may instead include a single index into a table of defined starting positions, vector directions, and/or vector lengths.

Another embodiment of the present invention comprises a computer-implemented method of generating a VGCO in a computer system by performing computer-implemented operations. The method includes defining a plurality of discrete elements arranged in a geometric shape and assigning one or more data bit values to each of the plurality of discrete elements. The method also includes storing the plurality of discrete elements in a computer-readable memory. The geometric shape may be a rectangular cuboid, for example.

A further embodiment of the present invention comprises a physical computer-readable storage medium having computer-executable instructions stored thereon which, when executed by a computer, cause the computer to generate a VGCO by defining a plurality of discrete elements arranged in a geometric shape, and assigning one or more data bit values to each of the plurality of discrete elements. The computer-executable instructions, when executed by a computer, further cause the computer to store the VGCO in a first computer-readable memory, and read a sequence of uncompressed data bits from a second computer-readable memory. The computer-executable instructions, when executed by a computer, also cause the computer to perform a search of the VGCO for the sequence of uncompressed data bits traversing a path of a contiguous portion of the plurality of discrete elements through the VGCO. The computer-executable instructions, when executed by a computer, further cause the computer to record a compression definition in a third computer-readable memory if the path is found through the VGCO as a result of the search, where the compression definition defines the path through the VGCO.

Another embodiment of the present invention comprises a data compression system. The data compression system includes means for generating a VGCO by defining a plurality of discrete elements arranged in a geometric shape, and assigning one or more data bit values to each of the plurality of discrete elements. The data compression system further includes means for storing the VGCO in a first computer-readable memory. The data compression system also includes means for reading a sequence of uncompressed data bits from a second computer-readable memory. The data compression system further includes means for searching the VGCO for the sequence of uncompressed data bits traversing a path of a contiguous portion of the plurality of discrete elements through the VGCO. The data compression system also includes means for recording a compression definition in a third computer-readable memory if the path is found through the VGCO as a result of the searching, where the compression definition defines the path through the VGCO.

A further embodiment of the present invention comprises a computer-implemented method of decompressing data in a computer system by performing computer implemented operations. The method includes reading a compression definition corresponding to a sequence of uncompressed data bits from a first computer-readable memory. The method further includes generating at least a portion of a VGCO wherein the VGCO defines a plurality of discrete elements arranged in a geometric shape and having one or more data bit values assigned to each of the plurality of discrete elements. The method also includes extracting the sequence of uncompressed data bits from the portion of the VGCO along a path of contiguous discrete elements through the portion of the VGCO as defined by the compression definition. The method further includes storing the sequence of uncompressed data bits in a second computer-readable memory. The geometric shape may be a rectangular cuboid. The path may be along an orthogonal direction (e.g., x-direction, y-direction, or z-direction) of the rectangular cuboid. Alternatively, the path may be along a diagonal direction through the rectangular cuboid. The compression definition may include an index, address, or coordinates of a starting element within the VGCO and a vector direction through the VGCO from the starting element. The compression definition may further include a vector length in terms of a number of contiguous elements. The compression definition may also include a compression object number identifying the VGCO. Alternatively, the compression definition may include an index, address, or coordinates of a starting element within the VGCO and an index, address, or coordinates of an ending element within the VGCO. The compression definition may further include a compression object number identifying the VGCO. The compression definition may instead include a single index into a table of defined starting positions, vector directions, and/or vector lengths. Generating at least a portion of the VGCO is accomplished using an apriori definition of a standard geometric compression object. The aprior definition may include at least one of an object-identifying number, an object-dimensioning coefficient, an object-generating formula, an object-generating algorithm, or a set of object set-up coefficients.

Another embodiment of the present invention comprises a physical computer-readable storage medium having computer-executable instructions stored thereon which, when executed by a computer, cause the computer to read a compression definition corresponding to a sequence of uncompressed data bits from a first computer-readable memory. The computer-executable instructions, when executed by a computer, further cause the computer to generate at least a portion of a VGCO wherein the VGCO defines a plurality of discrete elements arranged in a geometric shape and having one or more data bit values assigned to each of the plurality of discrete elements. The computer-executable instructions, when executed by a computer, also cause the computer to extract the sequence of uncompressed data bits from the portion of the VGCO along a path of contiguous discrete elements through the portion of the VGCO as defined by the compression definition. The computer-executable instructions, when executed by a computer, further cause the computer to store the sequence of uncompressed data bits in a second computer-readable memory.

A further embodiment of the present invention comprises a data decompression system. The system includes means for reading a compression definition corresponding to a sequence of uncompressed data bits from a first computer-readable memory. The system further includes means for generating at least a portion of a VGCO wherein the VGCO defines a plurality of discrete elements arranged in a geometric shape and having one or more data bit values assigned to each of the plurality of discrete elements. The system also includes means for extracting the sequence of uncompressed data bits from the portion of the VGCO along a path of contiguous discrete elements through the portion of the VGCO as defined by the compression definition. The system further includes means for storing the sequence of uncompressed data bits in a second computer-readable memory.

Another embodiment of the present invention comprises a computer-implemented method of encrypting data in a computer system by performing computer implemented operations. The method includes generating a virtual geometric encryption object by defining a plurality of discrete elements arranged in a geometric shape, and assigning one or more data bit values to each of the plurality of discrete elements. The method further includes storing the virtual geometric encryption object in a first computer-readable memory. The method also includes reading a sequence of unencrypted data bits from a second computer-readable memory and searching the virtual geometric encryption object for the sequence of unencrypted data bits traversing a path of a contiguous portion of the plurality of discrete elements through the virtual geometric encryption object. The method further includes recording an encryption definition in a third computer-readable memory, where the encryption definition defines the path through the virtual geometric encryption object, if the path is found through the virtual geometric encryption object as a result of the searching. The virtual geometric encryption object may be generated using at least one of an object-identifying number, an object-dimensioning coefficient, an object-generating formula, an object-generating algorithm, and a set of object set-up coefficients. The method may further include transmitting the encryption definition to a remote location without transmitting any of the object-identifying number, the object-dimensioning coefficient, the object-generating formula, the object-generating algorithm, and the set of object set-up coefficients.

These and other novel features of the subject matter of the present application, as well as details of illustrated embodiments thereof, will be more fully understood from the following description and drawings.

DETAILED DESCRIPTION

Figure 1:
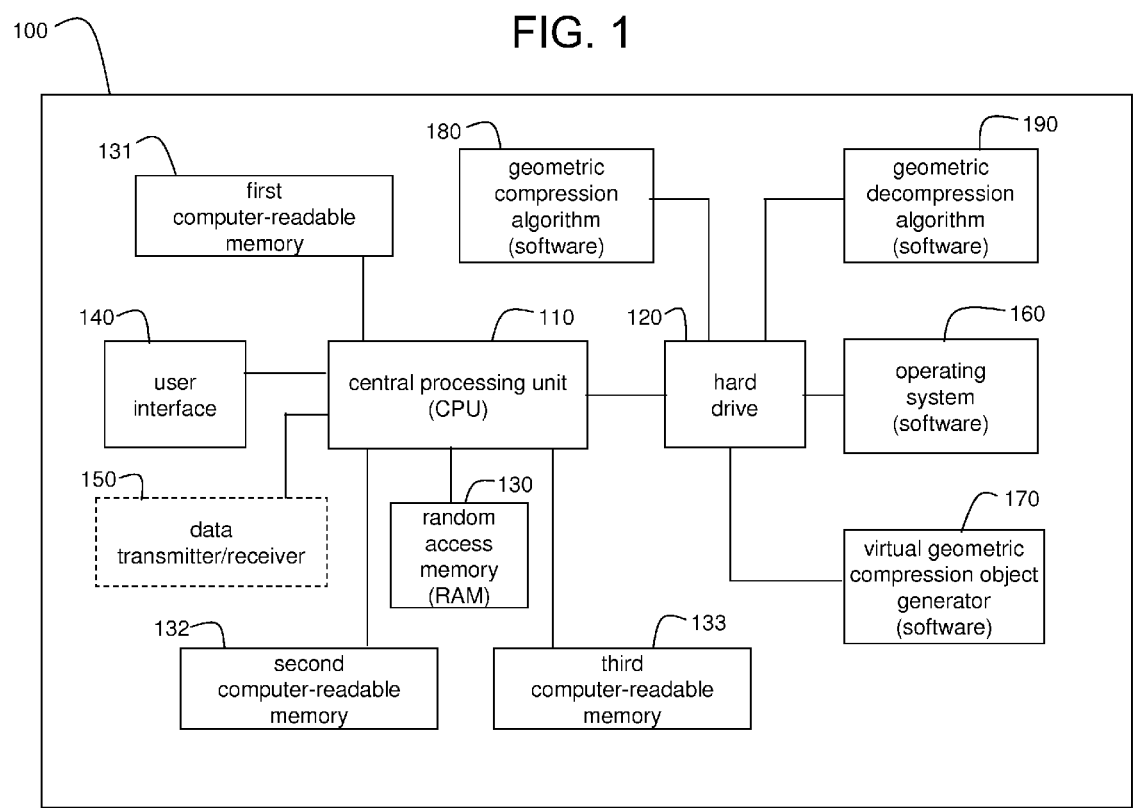
FIG. 1 illustrates a block diagram of a first embodiment of a system for performing geometric data compression/decompression and/or geometric data encryption/decryption.

FIG. 1 illustrates a block diagram of a first embodiment of a system 100 for performing geometric data compression/decompression and/or geometric data encryption/decryption. The system 100 includes a central processing unit (CPU) 110 and a hard drive 120 operatively connected to the CPU 110. The system 100 further includes a random access memory (RAM) 130 operatively connected to the CPU 110. The system 100 also includes a first computer-readable memory 131, a second computer-readable memory 132, and a third computer-readable memory 133 operatively connected to the CPU 110. In accordance with an embodiment of the present invention, the computer-readable memories 131-133 are each a portion of the RAM 130. In accordance with another embodiment of the present invention, the computer-readable memories 131-133 are separate from the RAM 130.

The system 100 also includes a user interface 140 operatively connected to the CPU 110. The user interface 140 may include, for example, a keyboard, a computer mouse, and a display. As an option, the system 100 may include a data transmitter/receiver 150 operatively connected to the CPU 110. The data transmitter/receiver 150 is capable of transmitting and receiving data to/from other systems over a network, for example.

In accordance with an embodiment of the present invention, the system 100 includes several software components that are stored on the hard drive 120. The software components include an operating system 160, a virtual geometric compression object (VGCO) generator 170, a geometric compression algorithm 180, and a geometric decompression algorithm 190. Each of the software components 160-190 include computer-executable instructions capable of being executed by the CPU 110.

The operating system 160 provides the management and coordination of activities and system resource sharing and further acts as a host for the various software components (e.g., 170-190) that are run on the CPU 110. The VGCO generator 170 generates a virtual geometric compression object (VGCO) within the system 100, as is described in detail later herein. A VGCO is a type of data structure that is generated and/or stored in the system 200 by defining a plurality of discrete elements arranged in a geometric shape and assigning one or more data bit values (e.g., a combination of binary data bit values) to each of the plurality of discrete elements.

Some possible geometric shapes of a VGCO may include a square, a rectangle, a rectangular cuboid, a circle, an ellipsoid, a polyhedral, a triangle, a pyramid, and a sphere. Many other geometric shapes are possible as well, in accordance with various embodiments of the present invention. A VGCO may be multi-dimensional, having two or more dimensions. For example, in accordance with certain embodiments of the present invention, a VGCO may have four or more dimensions, even though such numbers of dimensions cannot be readily visualized as a geometric object in three-dimensional space.

The geometric compression algorithm 180 operates on sequences of uncompressed data bits to compress and/or encrypt the data bits using a VGCO as is described in detail later herein. The geometric decompression algorithm 190 operates on compressed data bits to decompress and/or decrypt the data bits using at least a portion of a VGCO as is described in detail later herein. In accordance with an embodiment of the present invention, the software components 170-190 are loaded from the hard drive 120 into the RAM 130 to be executed by the CPU 110.

Figure 2:
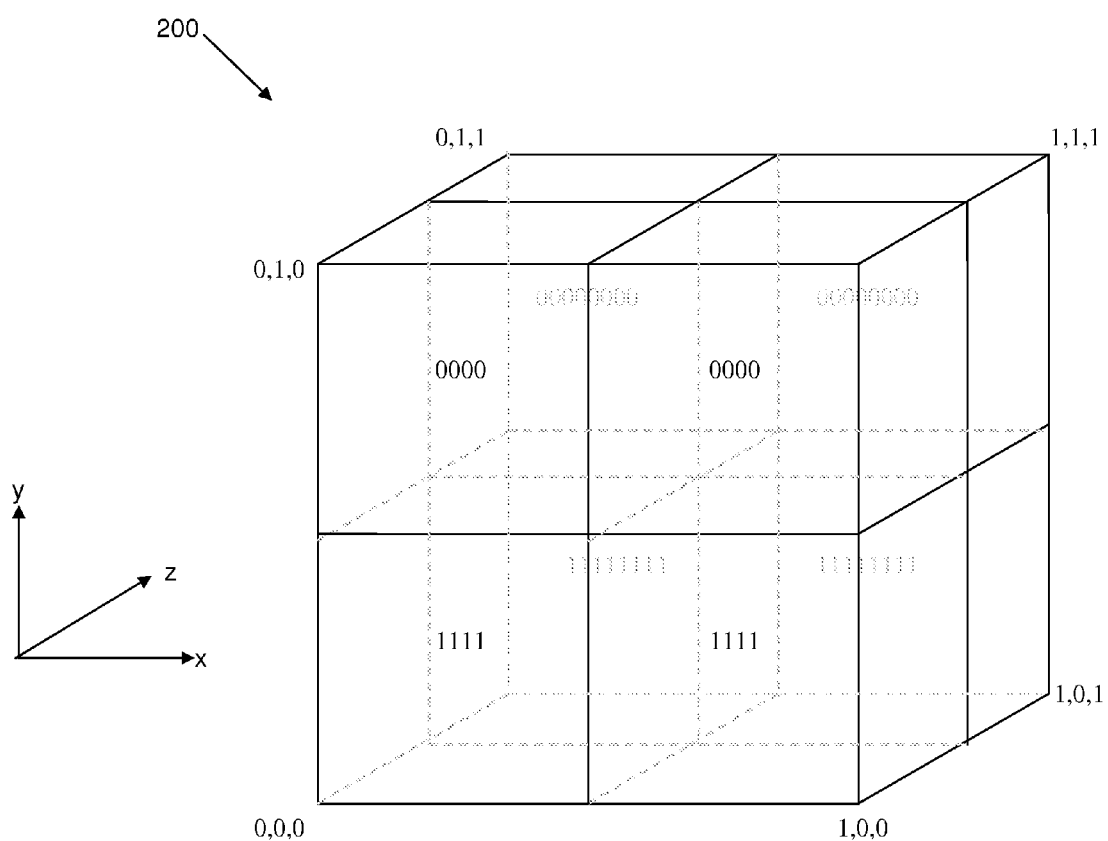
FIG. 2 illustrates a first example embodiment of a virtual geometric compression object (VGCO)

FIG. 2 illustrates a first example embodiment of a virtual geometric compression object (VGCO) 200. The VGCO 200 is generated within the system 100 and exists virtually within the system 100 (e.g., stored on the hard drive 120 or in the RAM 130). There is no need to display a representation of the VGCO 200 to a user. The VGCO 200 is generated by the system 100 using the VGCO generator 170. The VGCO 200 is generated by defining a plurality of discrete elements arranged in a geometric shape and assigning one or more data bit values to each of the plurality of discrete elements.

Referring to FIG. 2, the geometric shape of the VGCO 200 is a rectangular cuboid (in particular, a cube) made up of eight discrete elements in a 2×2×2 arrangement. Each discrete element of the VGCO 200 is indexed by three numbers including (0,0,0), (1,0,0), (0,1,0), (1,1,0), (0,0,1), (1,0,1), (0,1,1), and (1,1,1) corresponding to (x,y,z) coordinates. In general, a compression definition includes an index, address, or coordinates of a starting element within a VGCO. A compression definition may or may not include an index, address, or coordinates of an ending element within a VGCO. Furthermore, a compression definition may instead include a single index into a table of defined starting positions, vector directions, and/or vector lengths.

Each of the eight discrete elements is assigned one or more data bits. In particular, the discrete element indexed as (0,0,0) is assigned the data bits [1111]; the discrete element indexed as (1,0,0) is assigned the data bits [1111]; the discrete element indexed as (0,1,0) is assigned the data bits [0000]; the discrete element indexed as (1,1,0) is assigned the data bits [0000]; the discrete element indexed as (0,0,1) is assigned the data bits [11111111]; the discrete element indexed as (1,0,1) is assigned the data bits [11111111]; the discrete element indexed as (0,1,1) is assigned the data bits [00000000]; and the discrete element indexed as (1,1,1) is assigned the data bits [00000000]. Any discrete element of the VGCO 200 may be used as a starting point or and ending point in the compression process. Furthermore, any vector direction through the VGCO 200, from the starting point, may be defined. In this manner, a compression definition may be generated using the geometric compression algorithm 180 to compress and/or encrypt an uncompressed sequence of data bits.

For example, referring to the VGCO 200 of FIG. 2:

A simple illustration of how the compression method works is provided in FIG. 2. The provided sample data (sequence of uncompressed data bits) is chosen so that a straight forward example may be illustrated.

---

Sequence of uncompressed data bits:
11110000111111100000000111111110000000011111111111111111
Data length: 56 binary data bits.
Cube initialization definition: 2x2x2;
binary initialization; no length encoding.
Compressed component format: $b_1b_2b_3b_4b_5b_6$
$b_1b_2b_3$ = (x,y,z) index into the cube. (starting point)
$b_4b_5b_6$ = vector direction through the cube
(000 = left; 001 = right; 010 = up;
011 = down; 100 = in; 101 = out).
One possible grouping of the uncompressed sequence: 11110000, 1111111100000000, 1111111100000000, 1111111111111111
Compression definition grouping:
(000,up), (001,up), (001,up), (001,right).
Compression definition stream (binary): 000010001010001010001001
Compression definition stream length: 24 binary data bits.

As illustrated in the example, the initial uncompressed sequence of 56 data bits is broken up into four groups; and each of the four groups is represented as an index of a starting discrete element in the VGCO 200 and a vector direction or path through the VGCO 200. This is accomplished by performing a search of the VGCO 200 to match the assigned data bit values of a path of discrete elements through the VGCO 200 to the sequence of data bits to be compressed. Therefore, using the VGCO 200 of FIG. 2, the uncompressed data sequence of 56 data bits is compressed to a compression definition of 24 data bits, achieving a compression ratio of greater than 2:1. The compression definition of 24 data bits may be stored and/or transmitted to another location. In accordance with various embodiments of the present invention, a vector direction or path through a rectangular cuboid VGCO may be along an orthogonal direction (x, y, z) of the rectangular cuboid, or may be along a diagonal direction through the rectangular cuboid.

Figure 3:
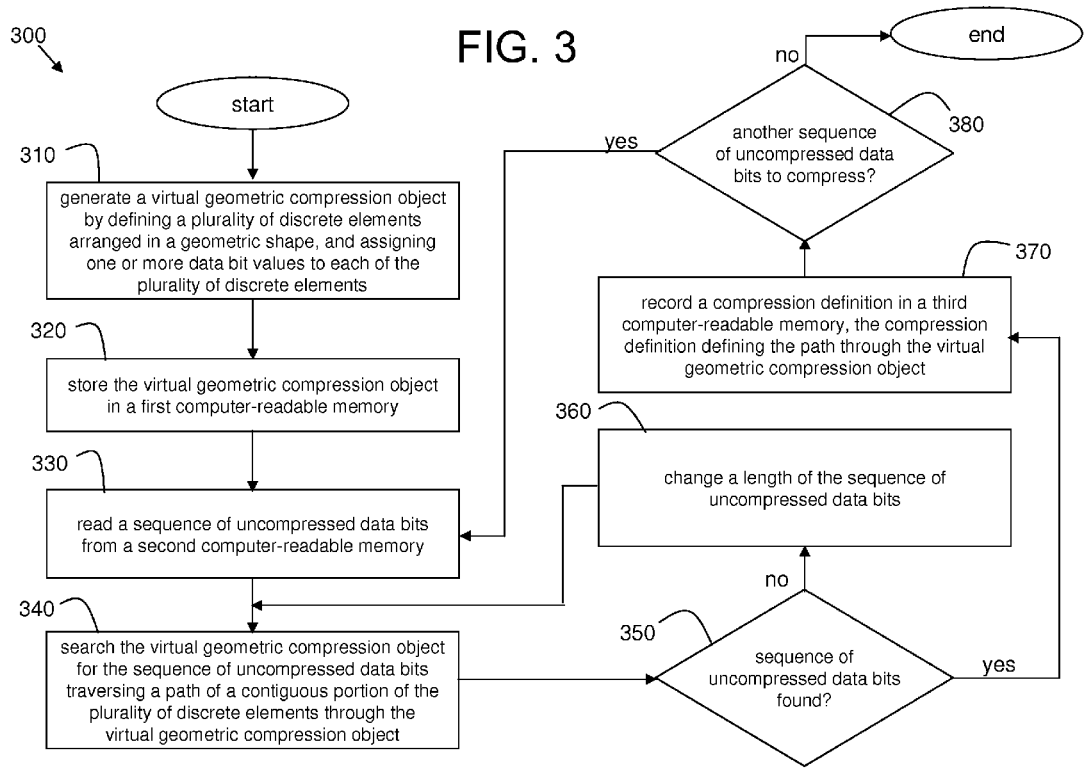
FIG. 3 is a flow chart of an embodiment of a computer-implemented method of compressing data in a computer system.

FIG. 3 is a flow chart of an embodiment of a computer-implemented method 300 of compressing data in a computer system 100 (e.g., the geometric compression algorithm 180). In step 310, a virtual geometric compression object (e.g., VGCO 200) is generated by defining a plurality of discrete elements arranged in a geometric shape and assigning one or more data bit values (e.g., one or more binary data bit values) to each of the plurality of discrete elements. In step 320, the VGCO is stored in a first computer-readable memory (e.g., 131). In step 330, a sequence of uncompressed data bits is read from a second computer-readable memory (e.g., 132). In step 340, the VGCO is searched for the sequence of uncompressed data bits traversing a path of a contiguous portion of the plurality of discrete elements through the VGCO.

In step 350, a determination is made as to whether or not the sequence of uncompressed data bits was found in the VGCO. If not, then in step 360, a length of the sequence of uncompressed data bits is reduced and the method reverts back to step 340. When the sequence of uncompressed data bits is found, then in step 370, a compression definition is recorded in a third computer-readable memory (e.g., 133), where the compression definition defines the path through the VGCO. In step 380, if there is still more data to compress, then the method reverts back to step 330 to read the next sequence of uncompressed data bits. Otherwise, the method ends.

For example, the compression definition may include a starting point and a vector direction for each of various contiguous portions (i.e., groups) of the sequence of uncompressed data bits, or for the entire sequence. Alternatively, the compression definition may include a starting point and an ending point for each of various contiguous portions of the sequence of uncompressed data bits, or for the entire sequence. In accordance with an embodiment of the present invention, the system 100 is used to perform the method 300.

Furthermore, even if the original sequence of uncompressed data bits is found in the VGCO, the method may include changing the length of the sequence of uncompressed data bits and performing another search as previously described herein. For example, if the original sequence of uncompressed data bits is found in the VGCO, a longer sequence of uncompressed data bits, which includes the original sequence of uncompressed data bits, may be read to see if such a longer sequence exists in the VGCO, thereby providing more compression.

In accordance with an embodiment of the present invention, a physical computer-readable storage medium is provided having computer-executable instructions thereon which, when executed by a computer (e.g., the system of FIG. 1), cause the computer to perform at least a portion of the method 300 of FIG. 3. The physical computer-readable storage medium may include any of a hard drive, a computer disk (e.g., a CD-ROM), an EEPROM, a magnetic tape, a memory stick, and a flash drive. Other physical computer-readable media are possible as well. However, the physical computer-readable storage medium does not include a computer-readable transmission medium such as, for example, a signal.

Figure 4:
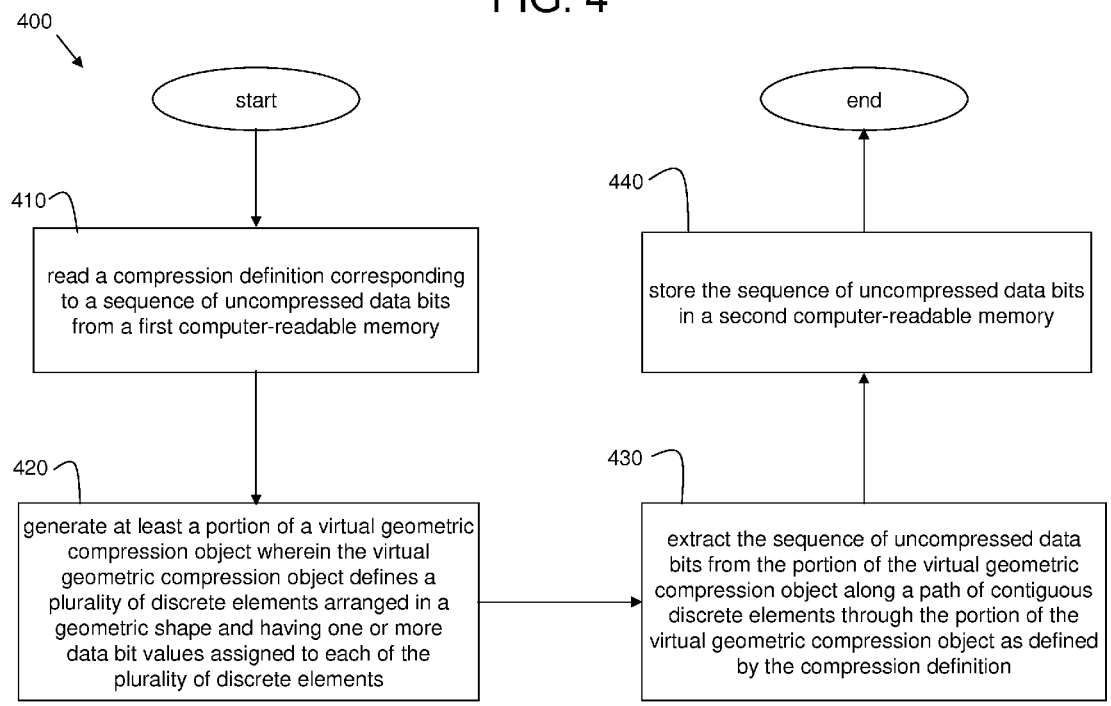
FIG. 4 is a flow chart of an embodiment of a computer-implemented method of decompressing data in a computer system.

To recover the original sequence of uncompressed data bits from the compression definition (i.e., from the sequence of compressed data bits), a geometric decompression algorithm is used (e.g., 190). FIG. 4 is a flow chart of an embodiment of a computer-implemented method 400 of decompressing data in a computer system 100. The computer system 100 may be the same system 100 used to compress the data, or may be a different system 100 (e.g., a system to which the compression definition was transmitted to, using a data transmitter/receiver 150). In general, for decompression, the VGCO does not have to be transmitted, along with the compression definition, to a receiving system 100, and does not have to be permanently stored.

In step 410 of the method 400, a compression definition, corresponding to a sequence of uncompressed data bits, is read from a first computer-readable memory (e.g., 131). In step 420, at least a portion of a virtual geometric compression object (VGCO) is generated (e.g., by the VGCO generator 170), wherein the VGCO defines a plurality of discrete elements arranged in a geometric shape and having one or more data bit values assigned to each of the plurality of discrete elements. In step 430, the sequence of uncompressed data bits is extracted from the portion of the VGCO along a path of contiguous discrete elements through the portion of the VGCO as defined by the compression definition. In step 440, the sequence of uncompressed data bits is stored in a second computer-readable memory (e.g., 132). The method 400 is executed by the system 100 using the geometric decompression algorithm 190, in accordance with an embodiment of the present invention.

Referring to FIG. 2 and the compression example described above herein, it is clear how the binary compression definition [000010001010001010001001] may be interpreted as the compression definition grouping [(000, up), (001, up), (001, up), (001, right)] and used to extract the sequence of uncompressed data bits [11111000011111111000000001111111000000001111111 111111111] from the VGCO 200 using the method 400. The step 420 of generating at least a portion of the VGCO is accomplished using an apriori definition of a standard geometric compression object. The apriori definition of a standard geometric compression object may include at least one of an object-identifying number, an object-dimensioning coefficient, an object-generating formula or algorithm, or a set of object set-up coefficients. Multiple VGCO's may be defined in a system 100 and are identified by at least one of an object-identifying number, an object-dimensioning coefficient, an object-generating formula or algorithm, or a set of object set-up coefficients.

For example, an object-identifying number (i.e., a compression object number) may identify a particular standard VGCO which the VGCO generator 170 of the system 100 knows, apriori, how to generate, even though the VGCO is not currently generated in the system 100. The object-identifying number may be incorporated into the compression definition at the time of data compression. Furthermore, the system 100 may only need to generate a portion of the identified standard VGCO using the apriori knowledge of the VGCO and the given compression definition under consideration.

As another example, an object-dimensioning coefficient may determine a particular VGCO which the system knows, apriori, how to generate, even though the VGCO is not currently generated in the system 100. The object-dimensioning coefficient may be incorporated into the compression definition at the time of compression. For example, if the object-dimensioning coefficient is '16', the VGCO generator 170 of the system 100 is programmed to know how to generate a standard 16×16×16 cubic VGCO with assigned data bit values. Again, the system 100 may only need to generate a portion of the identified standard VGCO using the apriori knowledge of the VGCO and the given compression definition under consideration.

As a further example, an object-generating algorithm may determine a particular VGCO which the system knows, apriori, how to generate, even though the VGCO is not currently generated in the system 100. For example, if the compression definition includes an object-identifying number, the object-identifying number may identify a particular algorithm programmed as part of the VGCO generator 170 to generate at least a portion of a particular VGCO having a particular shape and dimensions and having particular data bit values assigned to each of the discrete elements of the VGCO.

As a final example, a set of object set-up coefficients may determine a particular VGCO which the system knows, apriori, how to generate, even though the VGCO is not currently generated in the system 100. For example, if the compression definition includes an object-identifying number, the object-identifying number may identify a particular set of object set-up coefficients which may be used, for example, in conjunction with an object-generating formula to generate at least a portion of a particular VGCO having a particular shape and dimensions and having particular data bit values assigned to each of the discrete elements of the VGCO.

In accordance with an embodiment of the present invention, a physical computer-readable storage medium is provided having computer-executable instructions thereon which, when executed by a computer (e.g., the system 100 of FIG. 1), cause the computer to perform at least a portion of the method 400 of FIG. 4. The physical computer-readable storage medium may include any of a hard drive, a computer disk (e.g., a CD-ROM), an EEPROM, a magnetic tape, a memory stick, and a flash drive. Other physical computer-readable media are possible as well. However, the physical computer-readable storage medium does not include a computer-readable transmission medium such as, for example, a signal.

Figure 5:
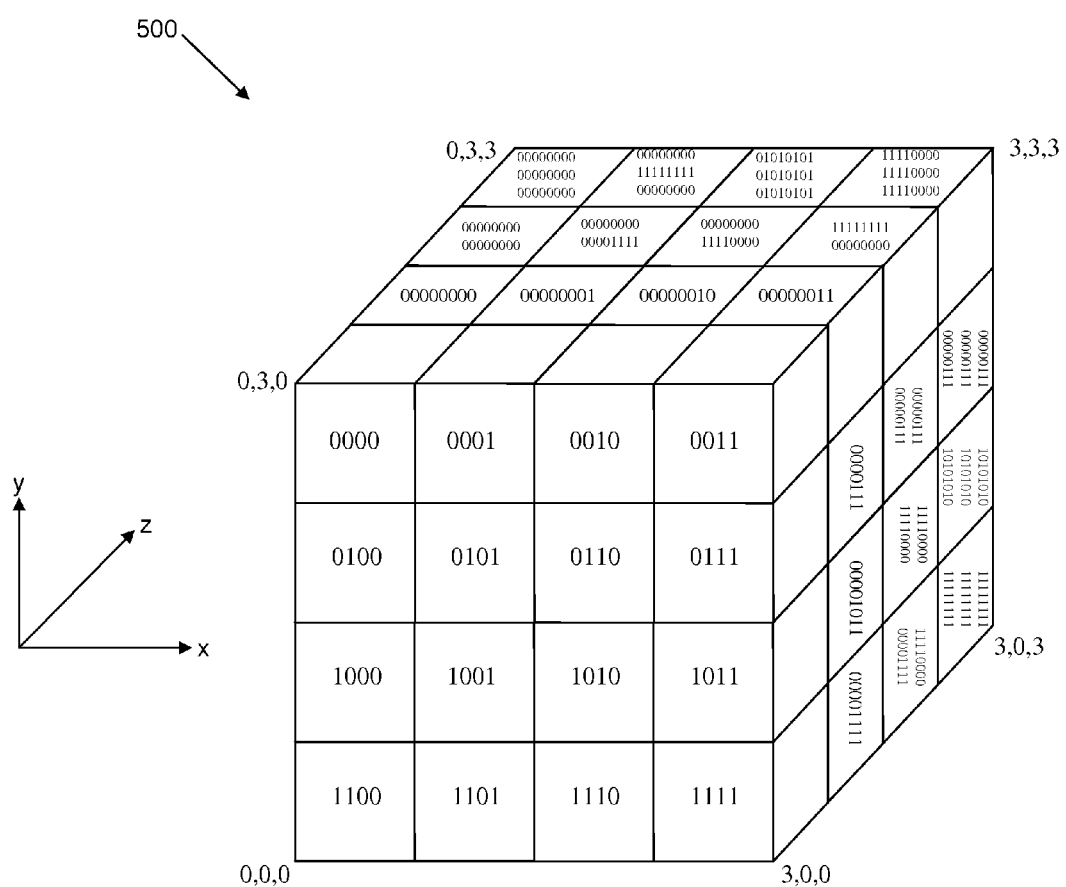
FIG. 5 illustrates a second example embodiment of a virtual geometric compression object (VGCO).

FIG. 5 illustrates a second example embodiment of a virtual geometric compression object (VGCO) 500. The VGCO 500 is generated within the system 100 and exists virtually within the system 100 (e.g., stored on the hard drive 120 or in RAM 130). There is no need to display a representation of the VGCO 500 to a user. The VGCO 500 is generated by the system 100 using the VGCO generator 170. The VGCO 500 is generated by defining a plurality of discrete elements arranged in a geometric shape and assigning one or more data bit values to each of the plurality of discrete elements.

Referring to FIG. 5, the geometric shape of the VGCO 500 is a cube made up of sixty-four discrete elements in a 4×4×4 arrangement. Each discrete element of the VGCO 500 is indexed by three numbers corresponding to (x,y,z) coordinates. Furthermore, each of the sixty-four discrete elements is assigned one or more data bit values. In particular, only a portion of the discrete elements are shown with their assigned data bit values in FIG. 5. Any discrete element of the VGCO 500 may be defined as a starting point or and ending point as part of the compression process. Furthermore, any direction through the VGCO 500, from the starting point, may be defined. In this manner, a compression definition may be generated using the geometric compression algorithm 180 to compress and/or encrypt an uncompressed sequence of data bits.

For example, referring to the VGCO 500 of FIG. 5:

An illustration of how the compression method works is provided in FIG. 5. The provided sample data (sequence of uncompressed data bits) is chosen so that a straight forward example may be illustrated. Real world scenarios could use assigned data bit values that could be calculated and data that is comprised of many more data bits. Also note that due to the complexity of the 3D drawing of FIG. 5, only several of the elements in the cube have been labeled with data bit values in order to improve readability.

---

Sequence of uncompressed data bits:
    111100001111000011110000111100100000001000000000111100000000
    00000000000000000000000000000000000000000001100110111101111
    0000000000000010000001000000011000001110000011111100001111
    00001111000000001111

Data length: 150 binary data bits.

Cube initialization definition: 4×4×4; cube #25; length encoding.

Compressed component format: $b_{1,1}b_{1,2}b_{2,1}b_{2,2}b_{3,1}b_{3,2}b_4b_5b_6b_{7,1}b_{7,2}$;
    $b_{1,1}\ b_{1,2}\ b_{2,1}\ b_{2,2}\ b_{3,1}\ b_{3,2}$ = (x,y,z) index into the cube; each index requires 2 bits since it is in the range of [0 .. 4];
    $b_4b_5b_6$ = direction to go in the cube (000 = left; 001 = right; 010 = up; 011 = down; 100 = in; 101 = out);
    $b_{7,1}\ b_{7,2}$ = length of the run; the length requires 2 bits since it is in the range of [0 ... 4].

One possible grouping of the uncompressed sequence:
    1111000011110000, 111100001111, 0010000000100000000011110000,
    00000000000000000000000000000000000000000000,
    1100110111101111, 00000000000000010000001000000011,
    000001110000011111110000111100001111000000001111

Compression definition grouping: (312,NA,0), (300,in,1), (230,in,2), (033,NA,0), (000,right,3), (031,right,3), (321,down,2);

Compression definition grouping (binary): (110110,000,00), (110000,100,01), (101100,100,10), (001111,000,00), (000000,001,11), (001101,001,11), (111001,011,10);

Compression definition stream (binary):
    11011000000110000100011011001001000111100000000000000011100110
    10011111100101110;

Compression definition stream length: 77 binary data bits.

As illustrated in the example, the initial uncompressed sequence of 150 data bits is broken up into seven groups, and each of the seven groups is represented as an index of a starting discrete element in the VGCO 500, a vector direction or path through the VGCO 500, and a vector length in number of contiguous elements. This is accomplished by performing a search of the VGCO 500 to match the assigned data bit values of a path of discrete elements through the VGCO 500 to the sequence of data bits to be compressed. Therefore, using the VGCO 500 of FIG. 5, the uncompressed data sequence of 150 data bits is compressed to a compression definition of 77 data bits, achieving a compression ratio of almost 2:1. The compression definition of 77 data bits may be stored and/or transmitted to another location. Again, to recover the original sequence of uncompressed data bits from the compression definition (i.e., from the sequence of compressed data bits), the geometric decompression algorithm 190 is used to perform the method 400, in accordance with an embodiment of the present invention.

Many other VGCO's having various shapes and various assigned data bit values are possible as well, in accordance with various embodiments of the present invention. For example, the discrete elements of a particular VGCO may be filled (i.e., assigned) with data bit values in an ordered manner, allowing easy indexing into the VGCO. For example, for a rectangular cuboid VGCO, initial discrete elements may be assigned a fewer number of bits and subsequent discrete elements may be assigned successively higher numbers of bits, according to a predefined pattern. Also, different VGCO's may have different types of compression definitions. For example, a VGCO having the shape of a circle may use a compression definition having an angle and a vector length, where the starting point is always at or near the center of the circle and the discrete elements project out radially from the center of the circle.

In accordance with certain embodiments of the present invention, a VGCO may be defined which provides data encryption but does not provide data compression. In fact, in certain particular embodiments, the length of an encrypted data sequence may be longer than the length of the original sequence to be encrypted. Such embodiments are valid in the sense that they may be used to provide data encryption/decryption if data compression is not desired or is not necessary. The system 100 and the methods 300 and 400 may be used to perform such data encryption/decryption. In such embodiments, the VGCO is more aptly called a virtual geometric encryption object (VGEO), a sequence of uncompressed data bits is more aptly called a sequence of unencrypted data bits, and a compression definition is more aptly called an encryption definition. Data bit values may be assigned to the discrete elements of the VGCO in a random or more complex manner in order to provide additional security. Furthermore, additional encryption security may be provided by not including any apriori definition of a standard geometric compression object when transmitting the encrypted data from a source location to a destination location. For example, no apriori definition including any of an object identifying number, an object-dimensioning coefficient, an object-generating formula, an object-generating algorithm, or a set of object set-up coefficients is provided.

However, in accordance with certain other embodiments of the present invention, data compression and encryption may be performed simultaneously using a single VGCO. Similarly, data decompression and data decryption may be performed simultaneously using a single VGCO. In such embodiments, the VGCO may not be a standard or well-ordered VGCO. Instead, the discrete elements of the VGCO may be assigned data bit values in a random manner or in a complex coded manner to provide extra security as well as data compression.

VGCO's may be designed which provide lossless data compression or lossy data compression. In lossless data compression, when a VGCO is searched for a sequence of uncompressed data bits traversing a path of contiguous discrete elements through the VGCO, the exact and complete sequence of uncompressed data bits needs to be found for the resultant compression to be lossless. However, with lossy data compression, the sequence of uncompressed data bits needs to be found in the VGCO only to within a certain error (e.g., +/−3 least significant bits). With lossy data compression, a certain amount of lost information is deemed to be acceptable upon recovery of the data during data decompression. Such lossy data compression may be acceptable in certain applications of image compression, for example.

In summary, systems, methods, and physical computer-readable storage media for performing geometric data compression and geometric data decompression are disclosed. A virtual geometric compression object is generated within a computer system by defining a plurality of discrete elements arranged in a geometric shape and assigning one or more data bit values to each of the plurality of discrete elements. The virtual geometric compression object is used by the computer system to compress sequences of uncompressed data bits into compression definitions. A compression definition defines a path through the virtual geometric compression object corresponding to a sequence of uncompressed data bits. In a reverse manner, for data decompression, at least a portion of a virtual geometric compression object is generated and a compression definition is used to extract a corresponding sequence of uncompressed data bits from the portion of the virtual geometric compression object.

While the claimed subject matter of the present application has been described with reference to certain embodiments, it will be understood by those skilled in the art that various changes may be made and equivalents may be substituted without departing from the scope of the claimed subject matter. In addition, many modifications may be made to adapt a particular situation or material to the teachings of the claimed subject matter without departing from its scope. Therefore, it is intended that the claimed subject matter not be limited to the particular embodiment disclosed, but that the claimed subject matter will include all embodiments falling within the scope of the appended claims.

What is claimed is:

1. A computer-implemented method of compressing data in a computer system comprising performing computer-implemented operations for:
   (a) generating a virtual geometric compression object by defining a plurality of discrete elements arranged in a geometric shape, and assigning one or more data bit values to each of said plurality of discrete elements;
   (b) storing said virtual geometric compression object in a first computer-readable memory;
   (c) reading a sequence of uncompressed data bits from a second computer-readable memory;
   (d) searching said virtual geometric compression object for said sequence of uncompressed data bits traversing a path of a contiguous portion of said plurality of discrete elements through said virtual geometric compression object;
   (e) recording a compression definition in a third computer-readable memory, said compression definition defining said path through said virtual geometric compression object, if said path is found through said virtual geometric compression object as a result of said searching; and (f) reducing a length of said sequence of uncompressed data bits and repeating steps (d) through (f) if said path is not found through said virtual geometric compression object as a result of said searching.

2. The computer-implemented method of claim 1 wherein said geometric shape is a rectangular cuboid.

3. The computer-implemented method of claim 1 wherein said path is along an orthogonal direction of said virtual geometric compression object.

4. The computer-implemented method of claim 1 wherein said path is along a diagonal direction through said virtual geometric compression object.

5. The computer-implemented method of claim 1 wherein said compression definition includes an index, address, or coordinates of a starting element within said virtual geometric compression object and a vector direction through said virtual geometric compression object from said starting element.

6. The computer-implemented method of claim 5 wherein said compression definition further includes a vector length in number of contiguous elements.

7. The computer-implemented method of claim 5 wherein said compression definition further includes a compression object number identifying said virtual geometric compression object.

8. The computer-implemented method of claim 1 wherein said compression definition includes an index, address, or coordinates of a starting element within said virtual geometric compression object and an index, address, or coordinates of an ending element within said virtual geometric compression object.

9. The computer-implemented method of claim 8 wherein said compression definition further includes a compression object number identifying said virtual geometric compression object.

10. The computer-implemented method of claim 1 wherein said compression definition includes a single index into a table of defined starting positions, vector directions, and/or vector lengths.

11. The computer-implemented method of claim 1 wherein said generating a virtual geometric compression object is accomplished using an apriori definition of a standard geometric compression object.

12. The computer-implemented method of claim 11 wherein said apriori definition includes at least one of an object-identifying number, an object-dimensioning coefficient, an object generating formula, an object-generating algorithm, and a set of object set-up coefficients.

13. A computer-implemented method of compressing data in a computer system comprising performing computer-implemented operations for:

(a) reading a sequence of uncompressed data bits from a first computer-readable memory;

(b) searching a defined virtual geometric compression object, stored in a second computer-readable memory, for said sequence of uncompressed data bits traversing a path of contiguous discrete elements through said virtual geometric compression object; and (c) recording a compression definition in a third computer-readable memory, said compression definition defining said path through said virtual geometric compression object, if said path is found through said virtual geometric compression object as a result of said searching.

14. The computer-implemented method of claim 13 further comprising performing computer-implemented operations for reducing a length of said sequence of uncompressed data bits and repeating steps (b) through (c) if said path is not found through said virtual geometric compression object as a result of said searching.

15. The computer-implemented method of claim 13 further comprising performing computer-implemented operations for changing a length of said sequence of uncompressed data bits and repeating steps (b) through (c).

16. The computer-implemented method of claim 13 wherein said virtual geometric compression object is defined as a plurality of discrete elements arranged in a geometric shape and having one or more data bit values assigned to each of said plurality of discrete elements.

17. The computer-implemented method of claim 16 wherein said geometric shape is a rectangular cuboid.

18. The computer-implemented method of claim 17 wherein said path is along an orthogonal direction of said rectangular cuboid.

19. The computer-implemented method of claim 17 wherein said path is along a diagonal direction through said rectangular cuboid.

20. The computer-implemented method of claim 16 wherein said compression definition includes an index, address, or coordinates of a starting element within said virtual geometric compression object and a vector direction through said virtual geometric compression object from said starting element.

21. The computer-implemented method of claim 20 wherein said compression definition further includes a vector length in number of contiguous elements.

22. The computer-implemented method of claim 20 wherein said compression definition further includes a compression object number identifying said virtual geometric compression object.

23. The computer-implemented method of claim 16 wherein said compression definition includes an index, address, or coordinates of a starting element within said virtual geometric compression object and an index, address, or coordinates of an ending element within said virtual geometric compression object.

24. The computer-implemented method of claim 23 wherein said compression definition further includes a compression object number identifying said virtual geometric compression object.

25. The computer-implemented method of claim 13 wherein said compression definition includes a single index into a table of defined starting positions, vector directions, and/or vector lengths.

26. The computer-implemented method of claim 13 wherein said virtual geometric compression object is generated using at least one of an object-identifying number, an object-dimensioning coefficient, an object generating formula, an object-generating algorithm, and a set of object set-up coefficients.

27. A physical computer-readable storage medium having computer-executable instructions stored thereon which, when executed by a computer, cause the computer to:

(a) generate a virtual geometric compression object by defining a plurality of discrete elements arranged in a geometric shape, and assigning one or more data bit values to each of said plurality of discrete elements;

(b) store said virtual geometric compression object in a first computer-readable memory;

(c) read a sequence of uncompressed data bits from a second computer-readable memory;

(d) perform a search of said virtual geometric compression object for said sequence of uncompressed data bits traversing a path of a contiguous portion of said plurality of discrete elements through said virtual geometric compression object; and (e) record a compression definition in a third computer-readable memory, said compression definition defining said path through said virtual geometric compression object, if said path is found through said virtual geometric compression object as a result of said search.

28. A data compression system, said system comprising:
(a) means for generating a virtual geometric compression object by defining a plurality of discrete elements arranged in a geometric shape, and assigning one or more data bit values to each of said plurality of discrete elements;
(b) means for storing said virtual geometric compression object in a first computer-readable memory;
(c) means for reading a sequence of uncompressed data bits from a second computer-readable memory;
(d) means for searching said virtual geometric compression object for said sequence of uncompressed data bits traversing a path of a contiguous portion of said plurality of discrete elements through said virtual geometric compression object; and
(e) means for recording a compression definition in a third computer-readable memory, said compression definition defining said path through said virtual geometric compression object, if said path is found through said virtual geometric compression object as a result of said searching.

29. A physical computer-readable storage medium having computer-executable instructions stored thereon which, when executed by a computer, cause the computer to:
(a) read a sequence of uncompressed data bits from a first computer-readable memory;
(b) perform a search of a defined virtual geometric compression object, stored in a second computer-readable memory, for said sequence of uncompressed data bits traversing a path of contiguous discrete elements through said virtual geometric compression object; and
(c) record a compression definition in a third computer-readable memory, said compression definition defining said path through said virtual geometric compression object, if said path is found through said virtual geometric compression object as a result of said search.

30. A data compression system, said system comprising:
(a) means for reading a sequence of uncompressed data bits from a first computer-readable memory;
(b) means for searching a defined virtual geometric compression object, stored in a second computer-readable memory, for said sequence of uncompressed data bits traversing a path of contiguous discrete elements through said virtual geometric compression object; and
(c) means for recording a compression definition in a third computer-readable memory, said compression definition defining said path through said virtual geometric compression object, if said path is found through said virtual geometric compression object as a result of said searching.

31. A computer-implemented method of decompressing data in a computer system comprising performing computer-implemented operations for:
(a) reading a compression definition corresponding to a sequence of uncompressed data bits from a first computer-readable memory;
(b) generating at least a portion of a virtual geometric compression object wherein said virtual geometric compression object defines a plurality of discrete elements arranged in a geometric shape and having one or more data bit values assigned to each of said plurality of discrete elements;
(c) extracting said sequence of uncompressed data bits from said portion of said virtual geometric compression object along a path of contiguous discrete elements through said portion of said virtual geometric compression object as defined by said compression definition; and
(d) storing said sequence of uncompressed data bits in a second computer-readable memory.

32. The computer-implemented method of claim 31 wherein said geometric shape is a rectangular cuboid.

33. The computer-implemented method of claim 31 wherein said path is along an orthogonal direction of said virtual geometric compression object.

34. The computer-implemented method of claim 31 wherein said path is along a diagonal direction through said virtual geometric compression object.

35. The computer-implemented method of claim 31 wherein said compression definition includes an index, address, or coordinates of a starting element within said virtual geometric compression object and a vector direction through said virtual geometric compression object from said starting element.

36. The computer-implemented method of claim 35 wherein said compression definition further includes a vector length in number of contiguous elements.

37. The computer-implemented method of claim 35 wherein said compression definition further includes a compression object number identifying said virtual geometric compression object.

38. The computer-implemented method of claim 31 wherein said compression definition includes an index, address, or coordinates of a starting element within said virtual geometric compression object and an index, address, or coordinates of an ending element within said virtual geometric compression object.

39. The computer-implemented method of claim 38 wherein said compression definition further includes a compression object number identifying said virtual geometric compression object.

40. The computer-implemented method of claim 31 wherein said generating at least a portion of said virtual geometric compression object is accomplished using an apriori definition of a standard geometric compression object.

41. The computer-implemented method of claim 40 wherein said apriori definition includes at least one of an object-identifying number, an object-dimensioning coefficient, an object-generating formula, an object-generating algorithm, and a set of object set-up coefficients.

42. The computer-implemented method of claim 31 wherein said compression definition includes a single index into a table of defined starting positions, vector directions, and/or vector lengths.

43. A physical computer-readable storage medium having computer-executable instructions stored thereon which, when executed by a computer, cause the computer to:
(a) read a compression definition corresponding to a sequence of uncompressed data bits from a first computer-readable memory;
(b) generate at least a portion of a virtual geometric compression object wherein said virtual geometric compression object defines a plurality of discrete elements arranged in a geometric shape and having one or more data bit values assigned to each of said plurality of discrete elements;

(c) extract said sequence of uncompressed data bits from said portion of said virtual geometric compression object along a path of contiguous discrete elements through said portion of said virtual geometric compression object as defined by said compression definition; and (d) store said sequence of uncompressed data bits in a second computer-readable memory.

44. A data decompression system, said system comprising:

(a) means for reading a compression definition corresponding to a sequence of uncompressed data bits from a first computer-readable memory;

(b) means for generating at least a portion of a virtual geometric compression object wherein said virtual geometric compression object defines a plurality of discrete elements arranged in a geometric shape and having one or more data bit values assigned to each of said plurality of discrete elements;

(c) means for extracting said sequence of uncompressed data bits from said portion of said virtual geometric compression object along a path of contiguous discrete elements through said portion of said virtual geometric compression object as defined by said compression definition; and (d) means for storing said sequence of uncompressed data bits in a second computer-readable memory.

45. A computer-implemented method of encrypting data in a computer system comprising performing computer-implemented operations for:

(a) generating a virtual geometric encryption object by defining a plurality of discrete elements arranged in a geometric shape, and assigning one or more data bit values to each of said plurality of discrete elements;

(b) storing said virtual geometric encryption object in a first computer-readable memory;

(c) reading a sequence of unencrypted data bits from a second computer-readable memory;

(d) searching said virtual geometric encryption object for said sequence of unencrypted data bits traversing a path of a contiguous portion of said plurality of discrete elements through said virtual geometric encryption object; and (e) recording an encryption definition in a third computer-readable memory, said encryption definition defining said path through said virtual geometric encryption object, if said path is found through said virtual geometric encryption object as a result of said searching.

46. The computer-implemented method of claim 45 wherein said virtual geometric encryption object is generated using at least one of an object-identifying number, an object-dimensioning coefficient, an object-generating formula, an object-generating algorithm, and a set of object set-up coefficients.

47. The computer-implemented method of claim 46 further comprising performing computer-implemented operations for transmitting said encryption definition to a remote location without transmitting any of said object-identifying number, said object-dimensioning coefficient, said object-generating formula, said object-generating algorithm, and said set of object set-up coefficients.

* * * * *